(12) United States Patent
Asano et al.

(10) Patent No.: US 10,964,478 B2
(45) Date of Patent: Mar. 30, 2021

(54) MULTILAYER CERAMIC ELECTRONIC COMPONENT INCLUDING ORGANIC LAYERS HAVING DIFFERENT COVERAGE RATES AND MOUNT STRUCTURE THEREFOR

(71) Applicant: Murata Manufacturing Co., Ltd., Nagaokakyo (JP)

(72) Inventors: Hiroshi Asano, Nagaokakyo (JP); Nobuyasu Hamamori, Nagaokakyo (JP); Masaru Takahashi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/721,971

(22) Filed: Dec. 20, 2019

(65) Prior Publication Data
US 2020/0203073 A1 Jun. 25, 2020

(30) Foreign Application Priority Data

Dec. 25, 2018 (JP) .............................. JP2018-240736

(51) Int. Cl.
*H01G 4/012* (2006.01)
*H01G 4/232* (2006.01)
(Continued)

(52) U.S. Cl.
CPC ........... *H01G 4/2325* (2013.01); *H01G 4/012* (2013.01); *H01G 4/248* (2013.01); *H01G 4/30* (2013.01);
(Continued)

(58) Field of Classification Search
CPC ........ H01G 4/012; H01G 4/12; H01G 4/2325; H01G 4/248; H01G 4/30; H01G 4/232; H01G 4/14; H01G 4/252; H05K 1/111; H05K 1/181; H05K 1/11; H05K 1/18; H05K 2201/10015
(Continued)

(56) References Cited

U.S. PATENT DOCUMENTS 10,121,595 B2 * 11/2018 Hamamori ........... H01G 4/2325
10,541,085 B2 * 1/2020 Asano ...................... H01G 4/30
(Continued)

FOREIGN PATENT DOCUMENTS

| JP | 2010-109238 A | 5/2010 |
| JP | 2010-278373 A | 12/2010 |
| JP | 2015-198236 A | 11/2015 |

OTHER PUBLICATIONS

ToF-SIMs—imaging—Vanbellingen et al.—pp. 1-29—May 2015.*

*Primary Examiner* — Timothy J Thompson
*Assistant Examiner* — Guillermo J Egoavil
(74) *Attorney, Agent, or Firm* — Keating & Bennett, LLP

(57) ABSTRACT

A multilayer ceramic capacitor satisfies a relationship A>B, where B represents a coverage rate of a first organic layer disposed on a first base electrode layer located on a first end surface, A represents a coverage rate of the first organic layer disposed on the first base electrode layer located on a first main surface or a second main surface, and A represents a coverage rate of the first organic layer located on the first main surface or the second main surface. A second end surface also has a similar configuration.

15 Claims, 3 Drawing Sheets

(51) Int. Cl.
  *H01G 4/248* (2006.01)
  *H01G 4/30* (2006.01)
  *H05K 1/11* (2006.01)
  *H05K 1/18* (2006.01)

(52) U.S. Cl.
  CPC .......... *H05K 1/111* (2013.01); *H05K 1/181* (2013.01); *H05K 2201/10015* (2013.01)

(58) Field of Classification Search
  USPC ...... 174/260; 361/321.2, 301.4, 321.5, 321.4
  See application file for complete search history.

(56) References Cited

U.S. PATENT DOCUMENTS

| | | | |
|---|---|---|---|
| 2004/0027769 A1* | 2/2004 | Denison | H01G 4/35 |
| | | | 361/118 |
| 2006/0254374 A1* | 11/2006 | Baklanov | H01L 22/14 |
| | | | 73/866 |
| 2009/0190285 A1* | 7/2009 | Kusano | H01G 4/232 |
| | | | 361/321.4 |
| 2010/0302704 A1 | 12/2010 | Ogawa et al. | |
| 2018/0061574 A1* | 3/2018 | Kitamura | H01G 4/012 |
| 2018/0082786 A1* | 3/2018 | Asano | H01G 4/232 |
| 2018/0082787 A1* | 3/2018 | Hamamori | H01G 4/005 |
| 2018/0082788 A1* | 3/2018 | Asano | H01G 4/232 |
| 2018/0286583 A1* | 10/2018 | Onoue | H01G 4/012 |
| 2020/0062601 A1* | 2/2020 | Ikeda | B01J 3/062 |

* cited by examiner

MULTILAYER CERAMIC ELECTRONIC COMPONENT INCLUDING ORGANIC LAYERS HAVING DIFFERENT COVERAGE RATES AND MOUNT STRUCTURE THEREFOR

CROSS REFERENCE TO RELATED APPLICATIONS

This application claims the benefit of priority to Japanese Patent Application No. 2018-240736 filed on Dec. 25, 2018. The entire contents of this application are hereby incorporated herein by reference.

BACKGROUND OF THE INVENTION

1. Field of the Invention

The present invention relates to a multilayer ceramic electronic component, for example, a capacitor, an inductor, and a resistor, and a mount structure of the multilayer ceramic electronic component.

2. Description of the Related Art

Multilayer ceramic electronic components, for example, capacitors, inductors, and resistors have been conventionally used in various electronic devices.

Such an electronic component typically includes a stack having two main surfaces opposed to each other in a stack direction, two lateral surfaces opposed to each other in a width direction orthogonal to the stack direction, and two end surfaces opposed to each other in a length direction orthogonal to the stack direction and the width direction.

Two or more external electrodes are provided on the outer surface of the stack. The external electrodes are formed on portions of the end surfaces and the main surfaces, on portions of the end surfaces and the lateral surfaces, or on portions of the end surfaces, the lateral surfaces, and the main surfaces. The external electrode has a generally C-shaped or L-shaped cross-section in the stack direction.

Such a multilayer ceramic electronic component is mounted on a substrate by electrically connecting portions of the external electrodes, which are formed mainly on the main surfaces or the lateral surfaces, to a land of the substrate with a joint material, for example, a solder therebetween.

In this mount structure, however, when the substrate warps due to thermal shock or the like, the stress associated with the warpage is transmitted to the stack through the land, the joint material, and the external electrodes, causing cracks, deformations, or the like in the ceramic portion or the internal electrode portion of the stack. This may lead to a decrease in performance or reliability of the multilayer ceramic electronic component.

Japanese Patent Laying-Open No. 2010-109238 discloses a ceramic electronic component including wraparound portions of the external terminal electrodes, each of which is provided with a leading-end spaced portion spaced away from the main surface of a ceramic body in order to prevent the ceramic body from becoming cracked due to the stress.

However, each of the wraparound portions of the external-terminal electrodes in Japanese Patent Laying-Open No. 2010-109238 has a corresponding one of base-end joints joined with the main surfaces of the ceramic body. This may allow the stress to propagate to the ceramic body through the base-end joints and the external-terminal electrodes, making it difficult to restrain cracks sufficiently.

SUMMARY OF THE INVENTION

Preferred embodiments of the present invention provide multilayer ceramic electronic components that, even when a substrate warps due to thermal shock or the like, are each able to restrain the propagation of a stress associated with the warpage to prevent cracks, while being mounted on the substrate.

A multilayer ceramic electronic component according to a preferred embodiment of the present invention includes a stack, a first external electrode, and a second external electrode. The stack includes a plurality of stacked ceramic layers and a plurality of stacked internal electrodes and has a first main surface and a second main surface opposed to each other in a stack direction, a first lateral surface and a second lateral surface opposed to each other in a width direction orthogonal to the stack direction, and a first end surface and a second end surface opposed to each other in a length direction orthogonal to the stack direction and the width direction. The first external electrode is electrically connected to the internal electrodes, is disposed on the first end surface, and has ends extending on the first main surface, the second main surface, the first lateral surface, and the second lateral surface. The second external electrode is electrically connected to the internal electrodes, is disposed on the second end surface, and has ends extending on the first main surface, the second main surface, the first lateral surface, and the second lateral surface. The first external electrode has a first base electrode layer including a conductive metal and a glass component, a first organic layer covering the first base electrode layer and including an organosilicon compound, and a first plating layer disposed on the first organic layer. The second external electrode has a second base electrode layer including a conductive metal and a glass component, a second organic layer covering the second base electrode layer and including an organosilicon compound, and a second plating layer disposed on the second organic layer. The first organic layer covers a surface of the stack from over the first base electrode layer, and the second organic layer covers the surface of the stack from over the second base electrode layer. The first plating layer includes a leading end which is in contact with the first organic layer, and the second plating layer includes a leading end which is in contact with the second organic layer. A coverage rate B of the first organic layer disposed on the first base electrode layer located on the first end surface, a coverage rate A of the first organic layer disposed on the first base electrode layer located on the first main surface and the second main surface, and a coverage rate A of the first organic layer disposed on the first main surface and the second main surface satisfy a relationship A>B, and a coverage rate B of the second organic layer disposed on the second base electrode layer located on the second end surface, a coverage rate A of the second organic layer disposed on the second base electrode layer located on the first main surface and the second main surface, and a coverage rate A of the second organic layer disposed on the first main surface and the second main surface satisfy a relationship A>B.

The above and other elements, features, steps, characteristics and advantages of the present invention will become

DETAILED DESCRIPTION OF THE PREFERRED EMBODIMENTS

Figure 1:
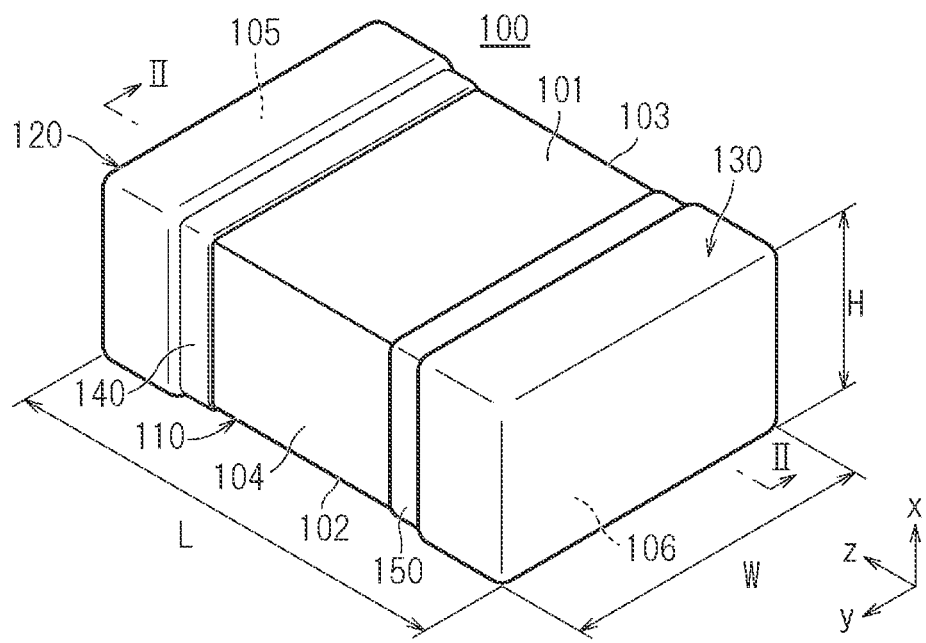
FIG. 1 is a perspective view showing an appearance of a multilayer ceramic electronic component according to a preferred embodiment of the present invention.

Multilayer ceramic electronic components according to preferred embodiments of the present invention will now be described in detail with reference to the drawings. The preferred embodiments described below will describe a multilayer ceramic capacitor as an example of the multilayer ceramic electronic component. The same or corresponding portions in the drawings are denoted by the same reference numerals, and description thereof will not be repeated.

Multilayer Ceramic Capacitor

Figure 2:
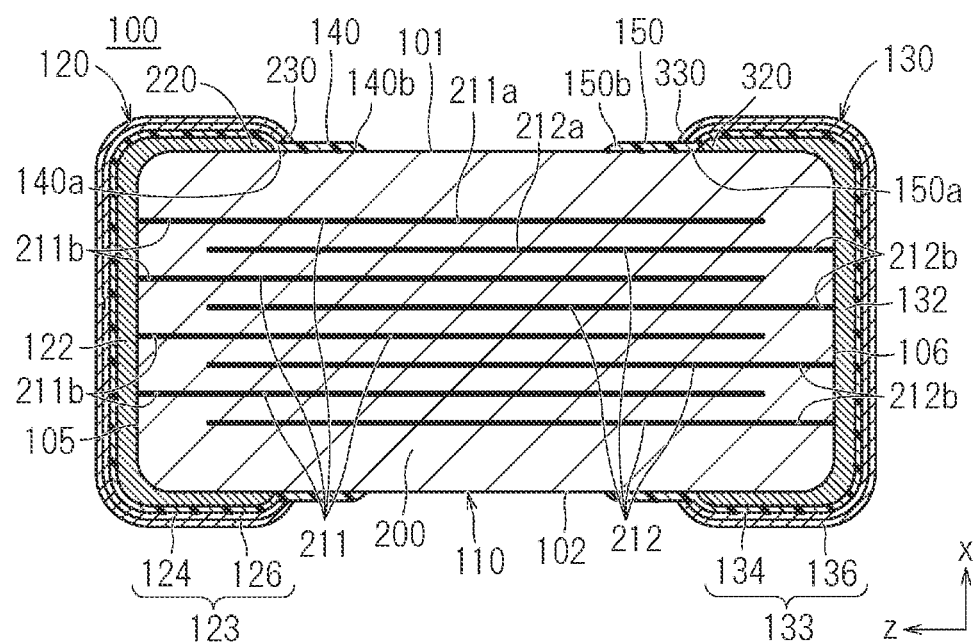
FIG. 2 is a sectional view of a multilayer ceramic electronic component according to a preferred embodiment of the present invention as seen from a direction of an arrow of line II-II in FIG. 1.
Figure 3:
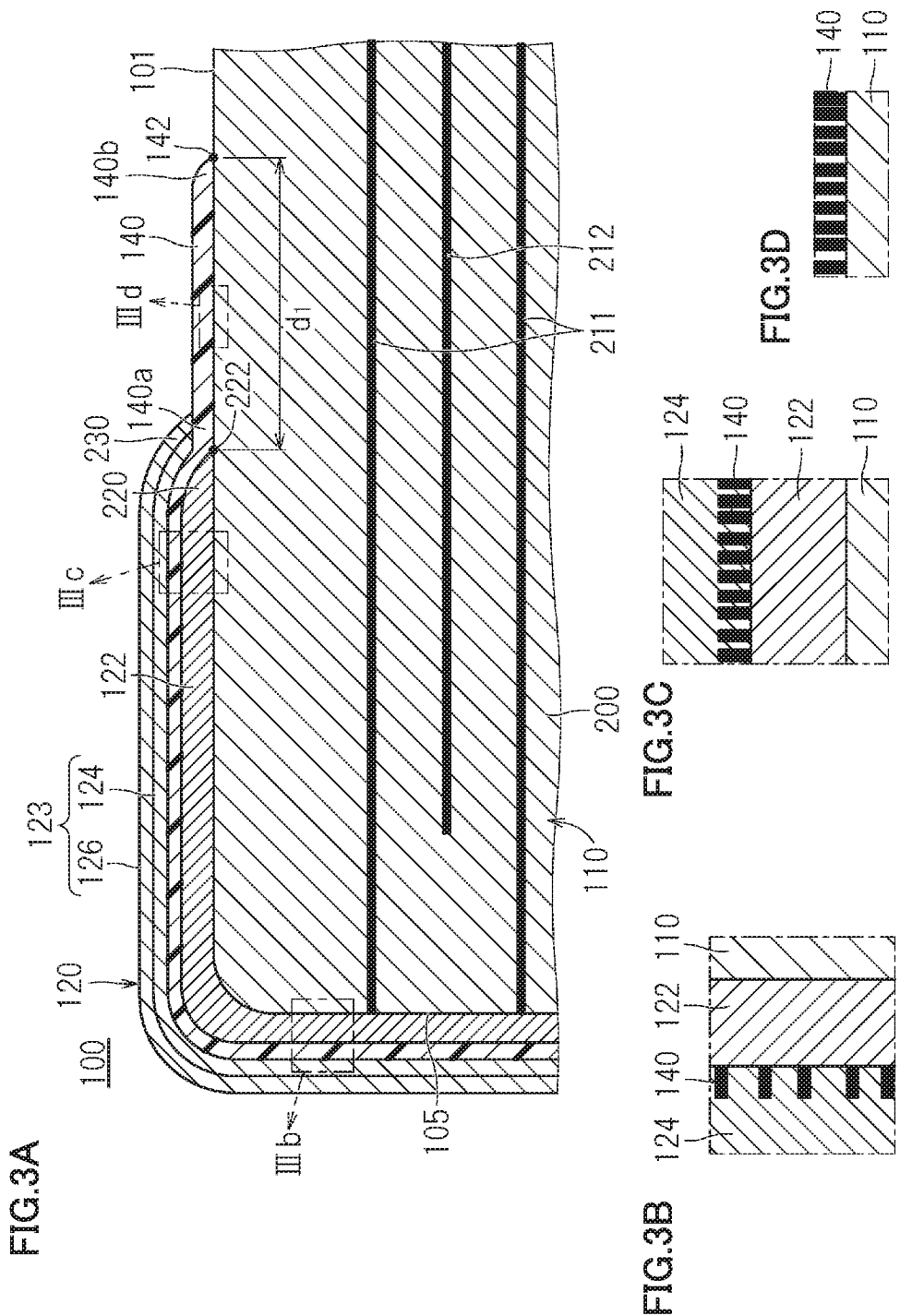
FIG. 3A is a sectional view of a multilayer ceramic electronic component according to a preferred embodiment of the present invention, which is a partially enlarged view of an external electrode of FIG. 2.
FIG. 3B is an enlarged view of a portion IIIb of FIG. 3A.
FIG. 3C is an enlarged view of a portion IIIc of FIG. 3A.
FIG. 3D is an enlarged view of a portion IIId of FIG. 3A.

FIG. 1 is a perspective view showing an appearance of a multilayer ceramic capacitor according to a preferred embodiment of the present invention. FIG. 2 is a sectional view of a multilayer ceramic electronic component according to a preferred embodiment as seen from a direction of an arrow of line II-II in FIG. 1. FIG. 3A is a sectional view of a multilayer ceramic electronic component according to a preferred embodiment, which is a partially enlarged view of an external electrode of FIG. 2. FIG. 3B is a partially enlarged view of a portion IIIb of FIG. 3A. FIG. 3C is an enlarged view of a portion IIIc of FIG. 3A. FIG. 3D is an enlarged view of a portion IIId of FIG. 3A.

A multilayer ceramic capacitor 100 according to a preferred embodiment of the present invention has a rectangular parallelepiped or a substantially rectangular parallelepiped shape and has a dimension in a length direction z, which will be described below, larger than the dimension in a width direction y, which will be described below. Examples of the rectangular parallelepiped or substantially rectangular parallelepiped shape include a shape of multilayer ceramic capacitor 100 with rounded corners and rounded ridges and a shape of multilayer ceramic capacitor 100 with a surface having a difference in level or unevenness.

Multilayer ceramic capacitor 100 includes a stack 110, a first external electrode 120, and a second external electrode 130.

Stack 110 includes a first main surface 101 and a second main surface 102 opposed to each other in a stack direction x of a plurality of ceramic layers, a first lateral surface 103 and a second lateral surface 104 opposed to each other in width direction y orthogonal or substantially orthogonal to stack direction x, and a first end surface 105 and a second end surface 106 opposed to each other in length direction z orthogonal or substantially orthogonal to stack direction x and width direction y.

Herein, the direction in which ceramic layers of stack 110 are stacked is defined as stack direction x, the direction connecting first external electrode 120 and second external electrode 130 of multilayer ceramic capacitor 100 among the directions orthogonal or substantially orthogonal to stack direction x is defined as length direction z of stack 110, and the direction orthogonal or substantially orthogonal to both of stack direction x and length direction z is defined as width direction y of stack 110. These terms will be used in the following description.

Stack 110 includes a plurality of ceramic layers 200 and a plurality of internal electrodes stacked alternately. Stack 110 preferably has a rectangular parallelepiped or a substantially rectangular parallelepiped shape. Stack direction x of ceramic layers 200 and the internal electrodes coincides with the height direction.

Stack 110 includes a plurality of first internal electrodes 211 and a plurality of second internal electrodes 212 disposed alternately in different layers.

First internal electrode 211 includes a first facing portion 211a preferably having a rectangular or a substantially rectangular shape and a first drawn-out portion 211b drawn out from first facing portion 211a to first end surface 105 of stack 110, as seen from stack direction x. The end surface of first drawn-out portion 211b is exposed to first end surface 105.

Second internal electrode 212 includes a second facing portion 212a preferably having a rectangular or a substantially rectangular shape and a second drawn-out portion 212b drawn out from second facing portion 212a to second end surface 106 of stack 110, as seen from stack direction x. The end surface of second drawn-out portion 212b is exposed to second end surface 106.

As shown in FIG. 2, first facing portion 211a of first internal electrode 211 and second facing portion 212a of second internal electrode 212 face each other with ceramic layer 200 therebetween, so as to generate a capacitance.

Ceramic layer 200 is preferably made of a dielectric ceramic material including, for example, $BaTiO_3$, $CaTiO_3$, $SrTiO_3$, $CaZrO_3$, $PbTiO_3$, or $Pb(Zr, Ti)O_3$ as its main component. Ceramic layer 200 may include a Mn compound, an Fe compound, a Cr compound, a Co compound, a Ni compound, or any other compound as an accessory component. Ceramic layer 200 preferably has a thickness of about 0.5 μm or more and about 10 μm or less, for example.

If stack 110 includes a piezoelectric ceramic, the multilayer ceramic electronic component functions as and defines a ceramic piezoelectric element. A specific example of the piezoelectric ceramic material is a PZT (lead zirconate titanate) ceramic material.

If stack 110 includes a semiconductor ceramic, the multilayer ceramic electronic component functions as and defines a thermistor element. A specific example of the semiconductor ceramic material is a spinel ceramic material.

If stack 110 includes a magnetic ceramic, the multilayer ceramic electronic component functions as and defines an inductor element. When the multilayer ceramic component functions as and defines the inductor element, the internal electrode is a coil-shaped conductor. A specific example of the magnetic ceramic material is a ferrite ceramic material.

First internal electrode 211 and second internal electrode 212 can be made of any appropriate conductive material, for example, a metal such as Ni, Cu, Ag, Pd, or Au, or an alloy including at least one of these metals (e.g., Ag—Pd alloy). Each of first internal electrode 211 and second internal electrode 212 preferably has a thickness of about 0.2 μm or more and about 2.0 μm or less, for example.

First external electrode 120 is disposed on first end surface 105 of stack 110 and includes ends extending on first main surface 101, second main surface 102, first lateral surface 103, and second lateral surface 104. First external electrode 120 is electrically connected with first internal electrodes 211.

Second external electrode 130 is disposed on second end surface 106 of stack 110 and includes ends extending on first main surface 101, second main surface 102, first lateral surface 103, and second lateral surface 104. Second external electrode 130 is electrically connected with second internal electrodes 212. First external electrode 120 and second external electrode 130 are spaced away from each other in length direction z of stack 110.

First external electrode 120 preferably includes, for example, a first base electrode layer 122 including a conductive metal and a glass component, a first organic layer 140 disposed to cover first base electrode layer 122 and including an organosilicon compound, and a first plating layer 123 disposed on first organic layer 140. Similarly, second external electrode 130 preferably includes, for example, a second base electrode layer 132 including a conductive metal and a glass component, a second organic layer 150 disposed to cover second base electrode layer 132 and including an organosilicon compound, and a second plating layer 133 disposed on second organic layer 150.

First base electrode layer 122 is disposed on first end surface 105 of stack 110 and includes ends extending on first main surface 101, second main surface 102, first lateral surface 103, and second lateral surface 104.

Second base electrode layer 132 is disposed on second end surface 106 of stack 110 and includes ends extending on first main surface 101, second main surface 102, first lateral surface 103, and second lateral surface 104.

First base electrode layer 122 and second base electrode layer 132 are formed by, for example, applying a conductive paste including a conductive metal and a glass component and baking the paste. A ceramic material of the same or similar kind as that of ceramic layer 200 may be used in place of the glass component. The conductive metal included in first base electrode layer 122 and second base electrode layer 132 is preferably, for example, Cu, Ni, Ag, Pd, an Ag—Pd alloy, or Au. The glass component included in first base electrode layer 122 and second base electrode layer 132 is preferably, for example, glass including B, Si, Ba, Mg, Al, or Li.

First base electrode layer 122 and second base electrode layer 132 are obtained by co-firing with the internal electrodes or by applying a conductive paste onto the surface of the fired stack 110 and baking the paste. For co-firing with the internal electrodes, a ceramic material of the same or similar kind as that of the ceramic layer is preferably used in place of glass, for example. Each of first base electrode layer 122 and second base electrode layer 132 preferably has a thickness of about 10 μm or more and about 50 μm or less at its thickest portion, for example.

First plating layer 123 covers first organic layer 140 disposed on first base electrode layer 122. Specifically, it is preferred that first plating layer 123 is disposed on first organic layer 140 disposed on first end surface 105 of stack 110, and is extended therefrom to first organic layer 140 disposed on first main surface 101, second main surface 102, first lateral surface 103, and second lateral surface 104 of stack 110.

Second plating layer 133 covers second organic layer 150 disposed on second base electrode layer 132. Specifically, it is preferred that second plating layer 133 is disposed on second organic layer 150 disposed on second end surface 106 of stack 110, and is extended therefrom to second organic layer 150 disposed on first main surface 101, second main surface 102, first lateral surface 103, and second lateral surface 104 of stack 110.

First plating layer 123 and second plating layer 133 preferably include, for example, at least one selected from Cu, Ni, Ag, Pd, an Ag—Pd alloy, Au, Sn, or the like. First plating layer 123 may include a plurality of layers, and preferably has a two-layer structure of a Ni plating layer 124 and a Sn plating layer 126, for example. Second plating layer 133 may include a plurality of layers, and preferably has a two-layer structure of a Ni plating layer 134 and a Sn plating layer 136, for example. Plating layer preferably has a thickness of about 1 μm or more and about 15 μm or less per layer, for example.

Ni plating layer 124 of first plating layer 123 is provided to cover first organic layer 140 covering the surface of first base electrode layer 122 of first external electrode 120. This prevents first organic layer 140 and first base electrode layer 122 from being eroded by a solder during mounting of multilayer ceramic capacitor 100.

Ni plating layer 134 of second plating layer 133 is provided to cover second organic layer 150 covering the surface of second base electrode layer 132 of second external electrode 130. This prevents second organic layer 150 and second base electrode layer 132 from being eroded by a solder during mounting of multilayer ceramic capacitor 100.

Sn plating layer 126 is additionally provided on Ni plating layer 124 of first external electrode 120, leading to significantly improved solder wettablity of first external electrode 120. Similarly, Sn plating layer 136 is additionally provided on Ni plating layer 134 of second external electrode 130, leading to significantly improved solder wettablity of second external electrode 130. This facilitates mounting of multilayer ceramic capacitor 100.

First organic layer 140 is disposed to cover first base electrode layer 122, and is extended therefrom to cover the surface of stack 110. In other words, first organic layer 140 is disposed to cover an end 220 of first base electrode layer 122. First organic layer 140 is disposed on first main surface 101, second main surface 102, first lateral surface 103, and second lateral surface 104, and the portion of the first organic layer 140 which is in contact with stack 110 is located at the position closer to first end surface 105 of stack 110 and wraps around the surface of stack 110. One end 140a of first organic layer 140 is in contact with stack 110 to cover end 220 of first base electrode layer 122 of first external electrode 120. The portion of first organic layer 140 which is in contact with stack 110 is disposed to extend from end 220 of first base electrode layer 122 to at least a portion of the surface of stack 110, and the other end 140b thereof is located on the second end surface 106 side relative to an end 230 of first plating layer 123 and is exposed. Further, end 230 of first plating layer 123 of first external electrode 120 is preferably in contact with the surface of one end 140a of the portion of first organic layer 140 which is in contact with stack 110, for example.

Second organic layer 150 is disposed to cover second base electrode layer 132, and is extended therefrom to cover the surface of stack 110. In other words, second organic layer 150 is disposed to cover an end 320 of second base electrode layer 132. Second organic layer 150 is disposed on first main surface 101, second main surface 102, first lateral surface 103, and second lateral surface 104, and the portion of the second organic layer 150 which is in contact with stack 110 is located at the position closer to second end surface 106 of stack 110 and wraps around the surface of stack 110. One end 150a of second organic layer 150 is in contact with stack 110 to cover an end 320 of second base electrode layer 132 of second external electrode 130. The portion of second organic layer 150 which is in contact with stack 110 is disposed to extend from end 320 of second base electrode layer 132 to at least a portion of the surface of stack 110, and the other end 150b thereof is located on the first end surface 105 side relative to an end 330 of second plating layer 133 and is exposed. Further, end 330 of second plating layer 133 of second external electrode 130 is preferably in contact with the surface of one end 150a of the portion of second organic layer 150 which is in contact with stack 110, for example.

The above features can provide a trigger for delamination, and when stress occurs, delamination can occur reliably between the base electrode layer and the plating layer.

The relationship A>B is satisfied, where B represents a coverage rate of first organic layer 140 disposed on first base electrode layer 122 located on first end surface 105, and A represents a coverage rate of first organic layer 140 disposed on first base electrode layer 122 located on first main surface 101 or second main surface 102 and a coverage rate of first organic layer 140 disposed on first main surface 101 or second main surface 102.

Also, the relationship A>B is satisfied, where B represents a coverage rate of second organic layer 150 disposed on second base electrode layer 132 located on second end surface 106, and A represents a coverage rate of second organic layer 150 disposed on second base electrode layer 132 located on first main surface 101 or second main surface 102 and a coverage rate of second organic layer 150 disposed on first main surface 101 or second main surface 102.

Coverage rate B of first organic layer 140 disposed on first base electrode layer 122 located on first end surface 105 and coverage rate B of second organic layer 150 disposed on second base electrode layer 132 located on second end surface 106 are also merely referred to as coverage rate B of an organic layer at an end surface portion.

Also, coverage rate A of first organic layer 140 disposed on first base electrode layer 122 located on first main surface 101 or second main surface 102, coverage rate A of first organic layer 140 disposed on first main surface 101 or second main surface 102, coverage rate A of second organic layer 150 disposed on second base electrode layer 132 located on first main surface 101 or second main surface 102, and coverage rate A of second organic layer 150 disposed on first main surface 101 or second main surface 102 are also merely referred to as coverage rate A of an organic layer at a main surface portion.

The above features allow the strength of adhesion between first base electrode layer 122 and first plating layer 123 which are located on first main surface 101 or second main surface 102 to be lower than the strength of adhesion between first base electrode layer 122 and first plating layer 123 which are located on first end surface 105, and allow the strength of adhesion between second base electrode layer 132 and second plating layer 133 located on first main surface 101 or second end surface 105 to be lower than the strength of adhesion between second base electrode layer 132 and second plating layer 133 located on second end surface 106. Thus, if the substrate warps due to thermal shock or the like with multilayer ceramic capacitor 100 mounted on the substrate, a stress associated with this warpage allows delamination between first base electrode layer 122 and first plating layer 123 of first external electrode 120, or delamination between second base electrode layer 132 and second plating layer 133 of second external electrode 130. This can distribute the stress to restrain cracks or deformations occurring in the ceramic portion or the internal electrode portion of multilayer ceramic capacitor 100. Herein, the crack is defined as cracking starting from the external electrode end and developing from the external layer portion toward the internal electrode layer portion.

On first end surface 105, since the strength of adhesion between first base electrode layer 122 and first plating layer 123 can be obtained, the strength of adhesion of first external electrode 120 can be obtained. Also on second end surface 106, since the strength of adhesion between second base electrode layer 132 and second plating layer 133 can be obtained, the strength of adhesion of second external electrode 130 can be obtained. This can attain the electrical connection reliability of first external electrode 120 and second external electrode 130.

As a result, the reliability of multilayer ceramic capacitor 100 can be significantly improved.

Coverage rate A of the organic layer at the main surface portion is preferably about 40% or more and about 80% or less, for example. This can restrain cracks occurring in stack 110 and also restrain poor plating or poor moisture proof reliability.

Coverage rate B of the organic layer at the end surface portion is preferably about 10% or more and about 40% or less, for example. This can restrain cracks occurring in stack 110 and also restrain poor plating, poor moisture proof reliability, and delamination of an end surface.

In use of first main surface 101 or second main surface 102 mounted to face the mount surface of the substrate, when first organic layer 140 or second organic layer 150 is provided at least on main surface of first main surface 101 and second main surface 102 which faces the mount surface, the direction of multilayer ceramic capacitor 100 can be selected easily during mounting.

The portion of first organic layer 140 which is disposed on stack 110 preferably has a thickness greater than the thickness of the portion of first organic layer 140 which is disposed on first base electrode layer 122, for example. This reliably allows delamination between first base electrode layer 122 and first plating layer 123. Similarly, the portion of second organic layer 150 which is disposed on stack 110 preferably has a thickness greater than the thickness of the portion of second organic layer 150 which is disposed on second base electrode layer 132, for example. This reliably allows delamination between second base electrode layer 132 and second plating layer 133. The portions of first organic layer 140 and second organic layer 150 which are disposed on first main surface 101 and second main surface 102 of stack 110 preferably have a thickness of about 5 nm or more and about 100 nm or less, for example. This can effectively restrain cracks of stack 110 and also restrain poor plating and detachment of multilayer ceramic capacitor 100.

First organic layer 140 and second organic layer 150 preferably include an organosilicon compound. The organosilicon compound may be, for example, decyltrimethoxysilane, n-propyltrimethoxysilane, or octyltriethoxysilane. In particular, an organosilicon compound which has the structure of multifunctional alkoxysilane Si—$(C_nH_{2n+1})_3$ and includes element N is preferably included in first organic layer 140 and second organic layer 150, for example. Accordingly, reliable adhesion without any failures, for example, poor reliability, is able to be provided.

The coverage rates of first organic layer 140 and second organic layer 150 can be calculated by measuring several points by TOFSIMS (Time-of-Flight Secondary Ion Mass Spectrometry). Specifically, cut grooves are formed at the main surface portion and the end surface portion of stack 110 to reach the base electrode layer, and each cut portion measures about 150 μm per side, and Ni plating layer 124 or Ni plating layer 134 at this portion is peeled off. Subsequently, the presence or absence of first organic layer 140 or second organic layer 150 is analyzed with a minute beam diameter (about 1 μm) by TOFSIMS. This analysis is performed at 100 spots, thus determining the coverage rates of first organic layer 140 and second organic layer 150 through calculation.

The measurement conditions by TOFSIMS are as follows.
Apparatus name: TOF. SIMS 5 (from ION-TOF, GmbH)
Condition: primary ion: Bi3++
Acceleration voltage: 25 kV
Mode: antibunching mode (BA mode)
Ion current: 0.07 nA
Measurement area: 50 μm×50 μm
Number of pixels: 256×256 pixels
Detected ion: positive ion
Neutralization: Electron gun used As shown in FIGS. 3A to 3D, a dimension di in length direction z of the portion of first organic layer 140 which is in contact with stack 110 (i.e., the dimension in length direction z from a leading end 222 of first base electrode layer 122 to a leading end 142 of first organic layer 140 on the second end surface 106 side) is preferably about 5 μm or more and about 100 μm or less, for example. Similar features also apply to the case of second organic layer 150. This reliably allows delamination between the base electrode layer and the plating layer without any failure, for example, poor soldering.

A portion free from the organic layer is located at some portion between first external electrode 120 and second external electrode 130 of multilayer ceramic capacitor 100. Accordingly, restraint of a failure, for example, decreased reliability due to the adhesion of the organic layer, is able to be provided.

Further, the coverage rate of first organic layer 140 disposed on first base electrode layer 122 located on first lateral surface 103 or second lateral surface 104 and the coverage rate of first organic layer 140 disposed on first lateral surface 103 or second lateral surface 104 are preferably substantially equal to coverage rate A of first organic layer 140 disposed on first base electrode layer 122 located on first main surface 101 or second main surface 102 and coverage rate A of first organic layer 140 disposed on first main surface 101 or second main surface 102, for example.

Also, the coverage rate of second organic layer 150 disposed on second base electrode layer 132 located on first lateral surface 103 or second lateral surface 104 and the coverage rate of second organic layer 150 disposed on first lateral surface 103 or second lateral surface 104 are preferably equal or substantially equal to coverage rate A of second organic layer 150 disposed on second base electrode layer 132 located on first main surface 101 or second main surface 102 and coverage rate A of second organic layer 150 disposed on first main surface 101 or second main surface 102, for example.

This eliminates the need to select the direction of multilayer ceramic capacitor 100 during mounting.

The strength of adhesion between first base electrode layer 122 of first external electrode 120 and stack 110 is preferably higher than the strength of adhesion between first organic layer 140 and first plating layer 123 of first external electrode 120, for example. Similarly, the strength of adhesion between second base electrode layer 132 of second external electrode 130 and stack 110 is preferably higher than the strength of adhesion between second organic layer 150 and second plating layer 133 of second external electrode 130, for example.

The strength of adhesion between stack 110 and first organic layer 140 is preferably higher than the strength of adhesion between first organic layer 140 and first plating layer 123, for example. Similarly, the strength of adhesion between stack 110 and second organic layer 150 is preferably higher than the strength of adhesion between second organic layer 150 and second plating layer 133, for example.

Consequently, if the substrate warps due to thermal shock or the like during mounting of an electronic component, delamination between the base electrode layer and the plating layer is allowed owing to the stress associated with this warpage. This can distribute the stress, thus restraining cracks or deformations occurring in the ceramic portion or the internal electrode portion of the electronic component.

As a result, the reliability of multilayer ceramic capacitor 100 can be significantly improved.

The dimension in length direction z of multilayer ceramic capacitor 100 including stack 110, first external electrode 120, and second external electrode 130 is represented by a dimension L, the dimension in stack direction x of multilayer ceramic capacitor 100 including stack 110, first external electrode 120, and second external electrode 130 is represented by a dimension T, and the dimension in width direction y of multilayer ceramic capacitor 100 including stack 110, first external electrode 120, and second external electrode 130 is represented by a dimension W.

Multilayer ceramic capacitor 100 according to a preferred embodiment of the present invention satisfies the relationship A>B, where B represents the coverage rate of first organic layer 140 disposed on first base electrode layer 122 located on first end surface 105 and A represents the coverage rate of first organic layer 140 disposed on first base electrode layer 122 located on first main surface 101 or second main surface 102 and the coverage rate of first organic layer 140 disposed on first main surface 101 or second main surface 102, and satisfies the relationship A>B, where B represents the coverage rate of second organic layer 150 disposed on second base electrode layer 132 located on second end surface 106 and A represents the coverage rate of second organic layer 150 disposed on second base electrode layer 132 located on first main surface 101 or second main surface 102 and the coverage rate of second organic layer 150 disposed on first main surface 101 or second main surface 102. Consequently, the strength of adhesion between the base electrode layer and the plating layer which are located on the main surface can be lower than the strength of adhesion between the base electrode layer and the plating layer which are located on the end surface. In the event that the substrate warps due to thermal shock or the like, when a stress associated with this warpage occurs, the external electrode can be delaminated between the base electrode layer and the plating layer on the main surface. This can distribute the stress to restrain, for example, cracks or deformations occurring in the ceramic portion or the internal electrode portion of multilayer ceramic capacitor 100.

Also, since the strength of adhesion between the base electrode layer and the plating layer can be obtained on the end surface, the strength of adhesion of the external electrode can be obtained to attain electrical connection reliability of the external electrode.

When an extremely high stress is applied, delamination is allowed between the base electrode layer and the plating layer also on the end surface to restrain, for example, cracks or deformations occurring in the ceramic portion or the internal electrode portion of the multilayer ceramic capacitor.

In multilayer ceramic capacitor 100 according to a preferred embodiment of the present invention, selection of the direction of multilayer ceramic capacitor 100 during mounting is not required by setting the coverage rate of first organic layer 140 disposed on first base electrode layer 122 located on first lateral surface 103 or second lateral surface 104 and the coverage rate of first organic layer 140 disposed on first lateral surface 103 or second lateral surface 104 to be substantially equal to coverage rate A of first organic layer 140 disposed on first base electrode layer 122 located on first main surface 101 or second main surface 102 and coverage rate A of first organic layer 140 disposed on first main surface 101 or second main surface 102 and by setting the coverage rate of second organic layer 150 disposed on second base electrode layer 132 located on first lateral surface 103 or second lateral surface 104 and the coverage rate of second organic layer 150 disposed on first lateral surface 103 or second lateral surface 104 to be substantially equal to coverage rate A of second organic layer 150 disposed on second base electrode layer 132 located on first main surface 101 or second main surface 102 and coverage rate A of second organic layer 150 disposed on first main surface 101 or second main surface 102.

Further, in multilayer ceramic capacitor 100 according to a preferred embodiment of the present invention, coverage rate A of the organic layer at the main surface portion is preferably about 40% or more and about 80% or less, and coverage rate B of the organic layer at the end surface portion is preferably about 10% or more and about 40% or less, for example. This can restrain cracks occurring in stack 110 and can also restrain poor plating or poor moisture proof reliability.

Further, in multilayer ceramic capacitor 100 according to a preferred embodiment of the present invention, the strength of adhesion between first base electrode layer 122 of first external electrode 120 and stack 110 is preferably higher than the strength of adhesion between first organic layer 140 and first plating layer 123 of first external electrode 120, for example. Similarly, the strength of adhesion between second base electrode layer 132 of second external electrode 130 and stack 110 is preferably higher than the strength of adhesion between second organic layer 150 and second plating layer 133 of second external electrode 130, for example. Thus, delamination is allowed between first organic layer 140 and first plating layer 123 and between second organic layer 150 and second plating layer 133, and adhesion can be maintained between the stack and first and second organic layers 140 and 150, thus reliably restraining infiltration of moisture or the like. This can further restrain a failure, for example, poor reliability of multilayer ceramic capacitor 100.

Further, in multilayer ceramic capacitor 100 according to a preferred embodiment of the present invention, the strength of adhesion between stack 110 and first organic layer 140 is preferably higher than the strength of adhesion between first organic layer 140 and first plating layer 123, for example. Similarly, the strength of adhesion between stack 110 and second organic layer 150 is preferably higher than the strength of adhesion between second organic layer 150 and second plating layer 133, for example. Consequently, if the substrate warps due to thermal shock or the like with multilayer ceramic capacitor 100 mounted on the substrate, delamination between first base electrode layer 122 and first plating layer 123 of first external electrode 120 and delamination between second base electrode layer 132 and second plating layer 133 of second external electrode 130 are allowed owing to a stress associated with the warpage more rationally. This can distribute the stress further to further restrain cracks or deformations occurring in the ceramic portion or the internal electrode portion of multilayer ceramic capacitor 100. As a result, the reliability of multilayer ceramic capacitor 100 can be further significantly improved.

In multilayer ceramic capacitor 100 according to a preferred embodiment of the present invention, an organosilicon compound which has the structure of multifunctional alkoxysilane Si—$(C_nH_{2n+1})_3$ and includes element N is preferably used as first organic layer 140 and second organic layer 150, for example. Consequently, the layers can be formed reliably on the surfaces of stack 110 and first base electrode layer 122 of first external electrode 120, effectively restraining cracks occurring in stack 110 owing to the actions of first organic layer 140 and second organic layer 150, leading to significantly improved reliability.

Mount Structure for Multilayer Ceramic Electronic Component

Figure 4:
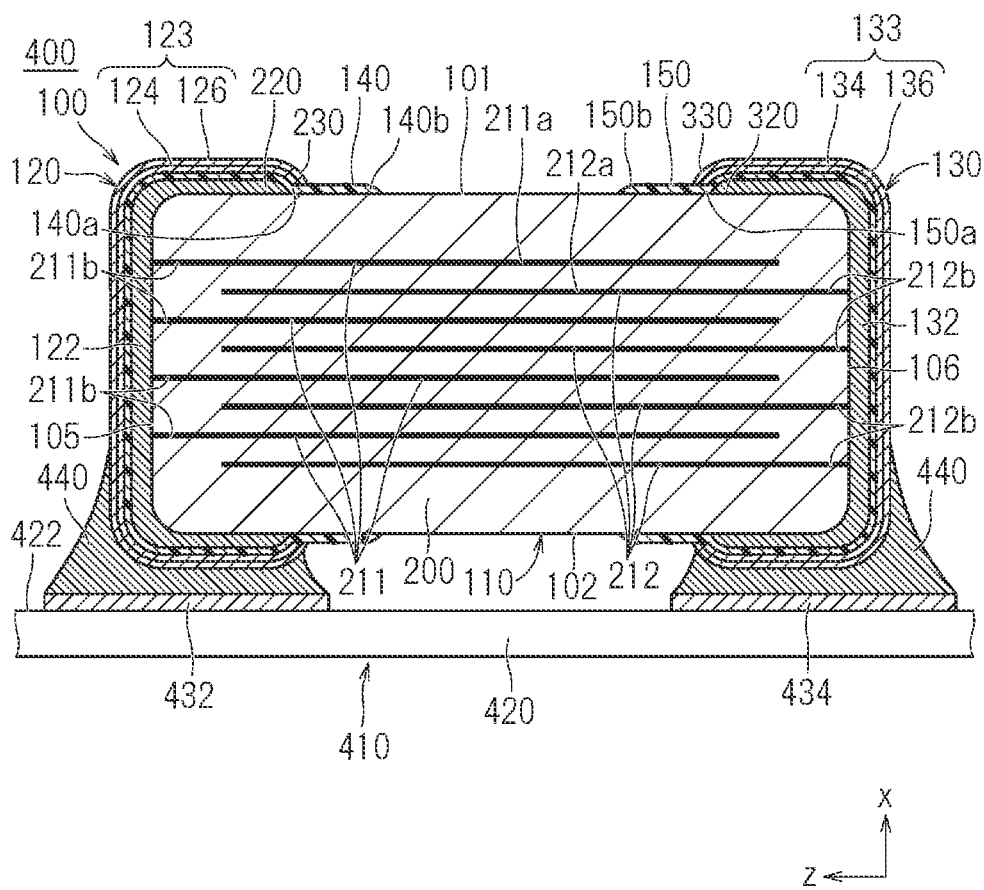
FIG. 4 is a sectional view showing an example mount structure for a multilayer ceramic electronic component according to the present invention.

The mount structure for the multilayer ceramic electronic component according to a preferred embodiment of the present invention will now be described with reference to FIG. 4. The case in which multilayer ceramic capacitor 100 shown in FIG. 1 is mounted on a substrate 410 will be described here as an example. FIG. 4 is a sectional view showing an example mount structure for the multilayer ceramic electronic component according a preferred embodiment of to the present invention. Multilayer ceramic capacitor 100 shown in FIG. 4 has the same or similar structure as that of multilayer ceramic capacitor 100 shown in FIGS. 1 to 3.

A mount structure 400 for the multilayer ceramic electronic component according to a preferred embodiment of the present invention includes multilayer ceramic capacitor 100 defining and functioning as a multilayer ceramic electronic component and substrate 410 to mount multilayer ceramic capacitor 100.

Substrate 410 includes a first signal electrode 432 and a second signal electrode 434 bonded on a main surface 422 of a core material 420 of substrate 410. Core material 420 may be a single layer or may include a plurality of layers. When core material 420 includes a plurality of layers, first signal electrode 432 and second signal electrode 434 may be provided on the surface of each core material 420 and electrically connected to signal electrodes (not shown) in different layers via wires (not shown) to establish wiring.

Core material 420 is made of a substrate provided by impregnating a base material including a mixture of glass fabric and glass nonwoven fabric with an epoxy resin or a polyimide resin, or a ceramic substrate manufactured by baking of a sheet including a mixture of ceramic and glass. Although the thickness of core material 420 is not particularly limited, it is preferably about 200 µm or more and about 1600 µm or less, for example.

First signal electrode 432 and second signal electrode 434 are bonded to one surface or both surfaces of core material 420 of substrate 410. The external electrodes of multilayer ceramic capacitor 100 are mounted on first signal electrode 432 and second signal electrode 434 by soldering. Although first signal electrode 432 and second signal electrode 434 may be formed of any material, they preferably include, for example, a metal such as Cu, Ag, Pd, or Pt, or an alloy thereof. In particular, Cu is preferred. The thicknesses of first signal electrode 432 and second signal electrode 434 are preferably about 15 µm or more and about 150 µm or less, for example.

With first main surface 101 and second main surface 102 or first lateral surface 103 and second lateral surface 104 of multilayer ceramic capacitor 100 facing main surface 422 of core material 420 in substrate 410, multilayer ceramic capacitor 100 is disposed with first external electrode 120 is in contact with first signal electrode 432 on substrate 410 and second external electrode 130 is in contact with second signal electrode 434 on substrate 410. Then, first external electrode 120 and first signal electrode 432 are bonded to each other while being electrically connected by a solder 440. Similarly, second external electrode 130 and second signal electrode 434 are bonded to each other while being electrically connected by solder 440.

With first main surface 101 and second main surface 102 or first lateral surface 103 and second lateral surface 104 of multilayer ceramic capacitor 100 facing main surface 422 of core material 420 in substrate 410, first external electrode 120 of multilayer ceramic capacitor 100 and first signal electrode 432 are electrically connected to each other, and second external electrode 130 of multilayer ceramic capacitor 100 and second signal electrode 434 are electrically connected to each other. Multilayer ceramic electronic component 100 may be mounted with a void provided between first base electrode layer 122 located on first main surface 101, second main surface 102 or first lateral surface 103, second lateral surface 104 and first organic layer 140 of multilayer ceramic capacitor 100 and a void provided between second base electrode layer 132 located on first main surface 101, second main surface 102 or first lateral surface 103, second lateral surface 104 and second organic layer 150 of multilayer ceramic capacitor 100.

Solder 440 may be any known solder without being particularly limited.

The above features allow the mount structure 400 for the multilayer ceramic electronic component shown in FIG. 4 to more easily release the stress of substrate 410.

Manufacturing Method

A non-limiting example of a method of manufacturing multilayer ceramic capacitor 100 according to a preferred embodiment of the present invention will now be described.

First, stack 110 including first internal electrodes 211 and second internal electrodes 212 is prepared. Specifically, a ceramic paste including ceramic powder is applied as a sheet by, for example, screen printing and dried, thereby producing mother ceramic green sheets.

Subsequently, an internal-electrode-forming conductive paste is printed on the mother ceramic green sheets in a predetermined pattern by, for example, screen printing to form internal-electrode-forming conductive patterns as first internal electrodes 211. Similarly, an internal-electrode-forming conductive paste is printed on other mother ceramic green sheets in a predetermined pattern by, for example, screen printing to form internal-electrode-forming conductive patterns as second internal electrodes 212.

In this way, the following are prepared: the mother ceramic green sheets with the internal-electrode-forming conductive patterns as first internal electrodes 211, the mother ceramic green sheets with the internal-electrode-forming conductive patterns as second internal electrodes 212, and the mother ceramic green sheets with no internal-electrode-forming conductive patterns. The ceramic paste and internal-electrode-forming conductive paste may include, for example, a known binder or solvent.

Subsequently, a mother stack is produced. The mother stack is produced as follows. A predetermined number of external-layer mother ceramic green sheets on which no internal-electrode-forming conductive patterns are printed are stacked, and thereon, the mother ceramic green sheets on which the internal-electrode-forming conductive patterns as first internal electrodes 211 are printed and the mother ceramic green sheets on which the internal-electrode-forming conductive patterns as second internal electrodes 212 are printed are stacked alternately in order. Further thereon, a predetermined number of external-layer mother ceramic green sheets on which no internal-electrode-forming conductive patterns are printed are stacked, thereby producing the mother stack. The mother stack may be pressed in the stack direction by, for example, isostatic pressing.

Subsequently, the mother stack is cut at predetermined positions, thereby cutting out a plurality of green stacks 110 of predetermined size. At this time, the corners or ridges of green stacks 110 may be rounded by, for example, barrel polishing.

Subsequently, green stacks 110 are fired, thereby producing stacks 110 in which first internal electrodes 211 and second internal electrodes 212 are disposed, first drawn-out portions 211b of first internal electrodes 211 are exposed to first end surface 105, and second drawn-out portions 212b of second internal electrodes 212 are exposed to second end surface 106. The firing temperature is appropriately set in accordance with the types of the ceramic material and the conductive material, for example, set in the range of about 900° C. or higher and about 1300° C. or lower.

Subsequently, the base electrode layers of the external electrodes are formed at the opposite ends of the fired stack 110. An external-electrode conductive paste is applied onto the opposite ends of the fired stack 110 and then baked, thereby forming first base electrode layer 122 of first external electrode 120 and second base electrode layer 132 of second external electrode 130. The firing temperature is preferably about 700° C. or higher and about 900° C. or lower, for example.

Subsequently, first organic layer 140 and second organic layer 150 are formed. First organic layer 140 and second organic layer 150 are produced in the step of forming an organic layer described below.

An organic processing liquid is applied to cover predetermined surfaces of first base electrode layer 122 of first external electrode 120, second base electrode layer 132 of second external electrode 130, and stack 110, thereby forming first organic layer 140 and second organic layer 150. In the step of forming first organic layer 140 and second organic layer 150, the organic processing liquid is applied in two separate steps. The coverage rate of first organic layer 140 and the coverage rate of second organic layer 150 can be controlled in accordance with the number of times of application of the organic processing liquid and the concentration of the organic processing liquid.

First, chips are placed onto a mask that is able to be held without exposing the ends surface of the chips, and the mask is applied with or immersed in the organic processing liquid and is then dried, followed by heat treatment. Accordingly, the organic layer is applied to other than first end surface 105 and second end surface 106.

Subsequently, the chips are removed from the mask, and the process of applying the organic processing liquid in the second step is performed. As in the first step, the mask is applied with or immersed in the organic processing liquid to form an organic layer also in the second step. Organic processing liquids having different concentrations are used as the organic processing liquid in the first step and the organic processing liquid in the second step, and in the second step, the organic processing liquid is applied and the end surfaces also wet up.

The above method forms organic layers on other than the end surface portion in the first step, and provides organic layers to the end surface portion and the lateral surface portion in the second step. Since the organic layer is formed only in the second step in the end surface portion, the coverage rate of the organic layer can be varied on the end surface and on the main surface and the lateral surface. This can result in the coverage rate of the organic layer at the main surface portion (and also the lateral surface portion when an organic layer is provided on the lateral surface) being greater than the coverage rate of the organic layer at the end surface portion, which is the feature of the present application. As a result, an organic layer can be formed sufficiently at the external electrode end which is the starting point of a crack, leading to a more remarkable effect of restraining cracks of multilayer ceramic capacitor 100. It is preferred that the organic processing liquid be applied repeatedly in each of the first step and the second step. This facilitates control of coverage rate A of the organic layer at the main surface portion and coverage rate B of the organic layer at the end surface portion.

Used as the organic processing liquid is an organic processing liquid of multifunctional alkoxysilane Si—$(C_nH_{2n+1})_3$, for example. Both the organic processing liquid in the first step and the organic processing liquid in the second step are preferably organosilicon compounds, for example.

The conditions of processing with the organic processing liquid in the first step are as follows: an organic processing liquid is diluted with an alcohol solvent to about 0.01 wt % or more and about 3.0 wt % or less, and a sample is immersed therein and is taken out therefrom, followed by drying at a temperature of about 100° C. or higher and about 200° C. or lower.

Further, the conditions of processing with the organic processing liquid in the second step and thereafter are as follows: an organic processing liquid is diluted with an alcohol solvent to about 0.01 wt % or more and about 3.0 wt % or less, and a sample is immersed therein and is taken out therefrom, followed by drying at a temperature of about 100° C. or higher and about 200° C. or lower.

A portion of the formed first organic layer 140 and a portion of the formed second organic layer 150 may be removed.

Subsequently, the plating layers of the external electrodes at the opposite ends of stack 110 are formed. First plating layer 123 of first external electrode 120 is formed to cover almost the entire surface of first base electrode layer 122 of first external electrode 120, and the end surface of end 230 of first plating layer 123 is formed to cover the surface of one end 140a of first organic layer 140. Similarly, second plating layer 133 of second external electrode 130 is formed to cover almost the entire surface of second base electrode layer 132 of second external electrode 130, and the end surface of end 330 of second plating layer 133 is formed to cover the surface of end 150a of second organic layer 150.

The above method can restrain, for example, cracks or deformations occurring in the ceramic portion or the internal electrode portion of stack 110, so that multilayer ceramic capacitor 100 having significantly improved performance or reliability can be manufactured easily.

Experimental Examples

Experimental examples conducted by the inventors of preferred embodiments of the present invention in order to confirm the advantageous effects of the preferred embodiments of present invention will now be described. In Experimental Example 1, multilayer ceramic capacitors being samples with sample Nos. 2 to 25 were produced by the manufacturing method according to the preferred embodiments, and the rate of occurrence of cracks, the rate of occurrence of poor plating, reliability (moisture resistance), and delamination of an end surface of the multilayer ceramic capacitor were determined.

(1) Production Conditions of Samples in Experimental Examples

The specifications of the multilayer ceramic capacitors are as follows.

Size: length L of 1.0 mm, width W of 0.5 mm, and height H of 0.5 mm

Ceramic material: $BaTiO_3$

Capacitance: 10 nF

Rated voltage: 16 V

The specifications of first external electrode 120 and second external electrode 130 are as follows.

Material of base electrode layer: material including a conductive metal (Cu) and a glass component Thickness of base electrode layer: 30 μm at the central portion of an end surface Organic layer at main surface portion: organic layer formed on end surface: multifunctional alkoxysilane Si— $(C_nH_{2n+1})_3$ including tris-(trimethoxysilylpropyl)isocyanurate Coverage rate A of organic layer at main surface portion: five types including 20%, 40%, 60%, 80%, and 100% (refer to Tables 1 to 4), where control of these coverage rates were adjusted by repeatedly performing the step of forming an organic layer.

Organic layer at end surface portion: organic layer formed on lateral surface: multifunctional alkoxysilane Si—$(C_nH_{2n+1})_3$ including of tris-(trimethoxysilylpropyl)isocyanurate Coverage rate B of organic layer at end surface portion: eight types including 5%, 10%, 20%, 40%, 60%, 80%, 90%, and 100% (see Tables 1 to 4), where control of these coverage rates were adjusted by repeatedly performing the step of forming an organic layer.

Plating layer: two layers of Ni plating layer (3 μm)+Sn plating layer (3 μm)

An experiment was also conducted to provide a relationship A<B between coverage rate A of the organic layer at the main surface portion and coverage rate B of the organic layer at the end surface portion. In this case, the sample having the relationship A<B between coverage rate A of the organic layer at the main surface portion and coverage rate B of the organic layer at the end surface portion was produced by applying the organic processing liquid with a mask that is able to expose only the end surface in the first step in the step of forming an organic layer and by applying the organic processing liquid without a mask in the second step.

As a conventional product, a sample with no organic layer formed by applying no organic processing liquid was produced (a sample with sample No. 1). This sample has a structure similar to that of a sample of any other sample number except for that no organic layer is formed.

The test method is as follows.

Multilayer ceramic capacitor 100 was mounted by applying a LF solder paste onto a JEITA land FR4 substrate having a thickness of about 1.6 mm to have a thickness of about 150 μm, mounting multilayer ceramic capacitor 100 thereon, and passing the substrate through a reflow furnace at about 240° C. five times. For comparison, similar mounting was performed for a multilayer ceramic capacitor with no organic layer formed by applying no organic processing liquid. The number of mounted multilayer ceramic capacitors is 100 for every type.

The mounted multilayer ceramic capacitor was placed on a hot plate at about 240V, the LF solder paste was melted, and then, the multilayer ceramic capacitor was removed from the substrate. Subsequently, polishing was performed from the direction orthogonal to the mount surface to determine the presence or absence of cracks or delamination of the end surface.

(2) Method of Evaluating Characteristics (a) Method of Measuring Coverage Rate of Organic Layer The coverage rates of first organic layer 140 and second organic layer 150 were determined by a method of measuring a plurality of points by TOFSIMS. A cut groove of about 150 μm was formed in each of the central portions of the lateral surface portion and the end surface portion of the chip, and first plating layer 123 or second plating layer 133 in this portion was peeled off. Then, the presence or absence of first organic layer 140 and second organic layer 150 was analyzed with a minute beam diameter (about 1 μm) by TOFSIMS. This analysis was performed at 100 points, and the coverage rates of first organic layer 140 and second organic layer 150 were determined through calculation.

The measurement conditions by TOFSIMS are as follows.
Apparatus name: TOF. SIMS 5 (from ION-TOF, GmbH)
Condition: primary ion: Bi3++
Acceleration voltage: 25 kV
Mode: antibunching mode (BA mode)
Ion current: 0.07 nA
Measurement area: 50 μm×50 μm
Number of pixels: 256×256 pixels
Detected ion: positive ion
Neutralization: Electron gun used (b) Method of Determining Occurrence of Cracks A crack has been defined as cracking starting from the external electrode end and developing from the external layer portion toward the internal electrode layer portion. Cracks were observed by the following method: cross-sectional polishing was performed from the direction orthogonal to the substrate-mounted surface (first or second lateral surface) to the central portion of the chip (position with ½ W), and then, cracks were observed under a SEM (scanning electron microscope) on the cross-section while focusing on the external electrode end.

(c) Method of Determining Poor Plating

Poor plating has been defined as a plating that was resulted in a tombstone shape obtained after multiple reflow tests, or a plating that was detached from the solder-mounted substrate and failed to provide conduction on the mounted substrate.

(d) Method of Testing Reliability

In the method of determining reliability (moisture resistance), multilayer ceramic capacitor 100 was mounted by applying a LF solder paste onto a JEITA land FR4 substrate having a thickness of about 1.6 mm to have a thickness of about 150 μm, placing multilayer ceramic capacitor 100 thereon, and passing the substrate through a reflow furnace at about 240° C. five times, as described above. Subsequently, a moisture resistance test was performed. As test conditions, a load of about 16 V was applied in the environment of about 85° C. and about 85% RH, and capacitance was measured after about 2000 hours. Then, a sample with variations of about 10% or more was determined to be poor plating.

(e) Method of Determining Delamination of End Surface

Cross-sectional polishing was performed from the direction orthogonal or substantially orthogonal to the substrate-mounted surface (first or second lateral surface) to the center of the chip (position with ½ W), and then, delamination was observed under a SEM on the cross-section while focusing on the end in the cross-section. A sample in which delamination between the base electrode layer and the plating layer was found was determined as a sample with delamination of the end surface.

Experimental Results

Tables 1 to 4 show Experimental results. Table 1 shows the results obtained by fixing coverage rate B of the organic layer at the end surface portion to about 10% and changing coverage rate A of the organic layer at the main surface portion between about 20% and about 100%. Table 2 shows the results obtained by fixing coverage rate B of the organic layer at the end surface portion to about 20% and changing coverage rate A of the organic layer at the main surface portion between about 20% and about 100%. Table 3 shows the results obtained by fixing coverage rate B of the organic layer to about 30% and changing coverage rate A of the organic layer at the main surface portion between about 20% and about 100%. Table 4 shows the results obtained by fixing coverage rate A of the organic layer at the main surface portion to about 60% and changing coverage rate B of the organic layer at the end surface portion between about 5% and about 100%. The samples with sample numbers including * are not within the scope of the preferred embodiments of the present invention.

TABLE 1

| Sample No. | Coverage rate A of organic layer at main surface portion (%) | Occurrence rate of cracks (%) | Occurrence rate of poor plating (%) | NG rate of reliability test (%) | Occurrence rate of delamination of end surface (%) |
|---|---|---|---|---|---|
| *1 | no organic layer | 88 | 0 | 30 | — |
| 2 | 20 | 10 | 0 | 5 | 0 |

TABLE 1-continued

| Sample No. | Coverage rate A of organic layer at main surface portion (%) | Occurrence rate of cracks (%) | Occurrence rate of poor plating (%) | NG rate of reliability test (%) | Occurrence rate of delamination of end surface (%) |
|---|---|---|---|---|---|
| 3 | 40 | 0 | 0 | 0 | 0 |
| 4 | 60 | 0 | 0 | 0 | 0 |
| 5 | 80 | 0 | 0 | 0 | 0 |
| 6 | 90 | 0 | 3 | 0 | 0 |
| 7 | 100 | 0 | 15 | 0 | 0 |

TABLE 2

| Sample No. | Coverage rate A of organic layer at main surface portion (%) | Occurrence rate of cracks (%) | Occurrence rate of poor plating (%) | NG rate of reliability test (%) | Occurrence rate of delamination of end surface (%) |
|---|---|---|---|---|---|
| * 8 | 20 | 20 | 0 | 5 | 10 |
| 9 | 40 | 0 | 0 | 0 | 0 |
| 10 | 60 | 0 | 0 | 0 | 0 |
| 11 | 80 | 0 | 0 | 0 | 0 |
| 12 | 90 | 0 | 3 | 0 | 0 |
| 13 | 100 | 0 | 15 | 0 | 0 |

TABLE 3

| Sample No. | Coverage rate A of organic layer at main surface portion (%) | Occurrence rate of cracks (%) | Occurrence rate of poor plating (%) | NG rate of reliability test (%) | Occurrence rate of delamination of end surface (%) |
|---|---|---|---|---|---|
| * 14 | 20 | 20 | 0 | 5 | 20 |
| 15 | 40 | 0 | 0 | 0 | 5 |
| 16 | 60 | 0 | 0 | 0 | 0 |
| 17 | 80 | 0 | 0 | 0 | 0 |
| 18 | 90 | 0 | 3 | 0 | 0 |
| 19 | 100 | 0 | 15 | 0 | 0 |

TABLE 4

| Sample No. | Coverage rate B of organic layer at end surface portion (%) | Occurrence rate of cracks (%) | Occurrence rate of poor plating (%) | NG rate of reliability test (%) | Occurrence rate of delamination of end surface (%) |
|---|---|---|---|---|---|
| 20 | 5 | 5 | 0 | 0 | 0 |
| 4 | 10 | 0 | 0 | 0 | 0 |
| 10 | 20 | 0 | 0 | 0 | 0 |
| 21 | 40 | 0 | 0 | 0 | 0 |
| * 22 | 60 | 0 | 0 | 0 | 10 |
| * 23 | 80 | 0 | 0 | 0 | 20 |
| * 24 | 90 | 5 | 3 | 0 | 40 |
| * 25 | 100 | 10 | 15 | 0 | 50 |

As shown in Table 1, the sample with sample No. 1, namely a conventional product, showed the occurrence of cracks at an occurrence rate of cracks of about 88%, and about 30% of samples were determined to be poor by the reliability test.

Meanwhile, Table 1 shows that when coverage rate A of the organic layer at the main surface was about 20% or more, which is the range where coverage rate A of the organic layer at the main surface portion is greater than coverage rate B of the organic layer at the end surface portion (i.e., in the cases of samples with sample Nos. 2 to 7), the results of the occurrence rate of cracks, the occurrence rate of poor plating, and reliability test, and the determination results of delamination of the end surface were excellent compared with the sample with sample No. 1, or a conventional product. Note that when coverage rate A of the organic layer at the main surface portion was about 90% or more (i.e., in the cases of samples with sample Nos. 6 and 7), poor plating was observed. Further, when coverage rate A of the organic layer at the main surface portions was about 40% or more and about 80% or less (i.e., in the cases of samples with sample Nos. 3 to 5), cracks, poor plating, poor reliability, and delamination of the end surface were not observed, leading to excellent results.

Tables 2 shows that when coverage rate A of the organic layer at the main surface portion was about 40% or more, which is the range where coverage rate A of the organic layer at the main surface portion is greater than coverage rate B of the organic layer at the end surface portion (i.e., in the cases of samples with sample Nos. 9 to 13), the results of the occurrence rate of cracks, the occurrence rate of poor plating, and reliability test, and the determination results of delamination of the end surface were excellent compared with the sample with sample No. 1, a conventional sample. Note that when coverage rate A of the organic layer at the main surface portion was about 90% or more (i.e., in the cases of samples with sample Nos. 12 and 13), poor plating was observed. Further, when coverage rate A of the organic layer at the main surface portions was about 40% or more and about 80% or less (i.e., in the cases of samples with sample Nos. 9 to 11), cracks, poor plating, poor reliability, and delamination of the end surface were not observed, leading to excellent results.

When coverage rate B of the organic layer at the end surface portion was about 20% (i.e., when coverage rate B=coverage rate A), delamination of the end surface was observed.

Tables 3 shows that when coverage rate A of the organic layer at the main surface portion was about 40% or more, which is the range where coverage rate A of the organic layer of the main surface is greater than coverage rate B of the organic layer at the end surface portion (i.e., in the cases of samples with sample Nos. 15 to 19), the results of the occurrence rate of cracks, the occurrence rate of poor plating, and reliability test, and the determination results of delamination of the end surface were excellent compared with the sample with sample No. 1, or a conventional product. Note that when coverage rate A of the organic layer at the main surface portion was about 90% or more (i.e., in the cases of samples with sample Nos. 18 and 19), poor plating was observed. Further, when coverage rate A of the organic layer at the main surface portion was about 60% or more and about 80% or less (i.e., in the cases of samples with sample Nos. 16 and 17), cracks, poor plating, poor reliability, and delamination of the end surface were not observed, leading to excellent results. Note that delamination of the end surface was observed in about 5% of the samples when coverage rate A of the organic layer was about 40% (i.e., in the case of the sample with sample No. 15), causing no particular problems in yields during mounting and manufacturing.

Also, when coating rate B of the organic layer was about 20% (i.e., when coverage rate B>coverage rate A), delamination of the end surface was observed.

Tables 4 shows that when coverage rate A of the organic layer at the main surface portion was about 5% or more and about 40% or less, which is the range where coverage rate A of the organic layer of the main surface is greater than coverage rate B of the organic layer at the end surface portion (i.e., in the cases of samples with sample Nos. 4, 10, 20, and 21), the results of the occurrence rate of cracks, the occurrence rate of poor plating, and reliability test, and the determination results of delamination of the end surface were excellent compared with the sample with sample No. 1, or a conventional product. Further, when coverage rate B of the organic layer at the end surface portion was about 10% or more and about 40% or less (i.e., in the cases of samples with sample Nos. 4, 10, and 21), cracks, poor plating, poor reliability, and delamination of the end surface were not observed, resulting in excellent results.

Also, when coating rate B of the organic layer at the end surface portion was about 60% or more at which coverage rate B≥coverage rate A (i.e., in the cases of samples with sample Nos. 22 to 25), delamination of the end surface was observed.

Every crack extended at an angle of about 45° relative to the stack toward the lateral surface of the chip, starting from an e-dimension end of the external electrode. Also, the organic-layer-processed product in which no cracks were observed was examined closely under a SEM, and slight delamination was observed between the external electrode and a Ni plating.

The above results reveal that, for the multilayer ceramic capacitor, the strength of adhesion between the base electrode layer and the plating layer which are located on the main surface can be lower than the strength of adhesion between the base electrode layer and the plating layer which are located on the end surface when an organic layer is provided to cover between the base electrode layer including a conductive metal and the plating layer and also cover the surface of the stack, and the relationship A>B is satisfied among coverage rate B of the organic layer (the organic layer at the end surface portion) disposed on the base electrode layer located on the end surface, coverage rate A of the organic layer disposed on the base electrode layer located on the main surface, and coverage rate A of the organic layer (the organic layer at the main surface portion) located on the main surface.

Thus, in the event that the substrate warps due to thermal shock or the like, when a stress associated with this warpage occurs, the external electrode can be delaminated between the base electrode layer and the plating layer on the main surface. This can distribute the stress to restrain cracks or deformations occurring in the ceramic portion and the internal electrode portion of the multilayer ceramic capacitor. Also, since the strength of adhesion between the base electrode layer and the plating layer can be obtained on the end surface, the strength of adhesion of the external electrode can be obtained, thus attaining electrical connection reliability of the external electrode.

It is also revealed that when coverage rate A of the organic layer at the main surface portion is about 40% or more and about 80% or less, the occurrence of cracks in the stack can be restrained, and poor plating or poor results in reliability test can be restrained.

It is further revealed that when coverage rate B of the organic layer at the end surface portion is about 10% or more and about 40% or less, the occurrence of cracks in the stack can be restrained, and poor plating or poor results in reliability test can be restrained.

It is further revealed that as coverage rate A of the organic layer at the main surface portion or coverage rate B of the organic layer at the end surface portion becomes higher, plating is applied less easily, and poor plating occurs more easily.

Although preferred embodiments of the present invention have been disclosed above, the present invention is not limited thereto.

In other words, in connection with the mechanism, shape, material, number, position, arrangement or the like in the preferred embodiments described above, various modifications can be made without departing from the scope of the technical idea and purpose of the present invention, and such modifications can be included in the present invention.

Figure 5:
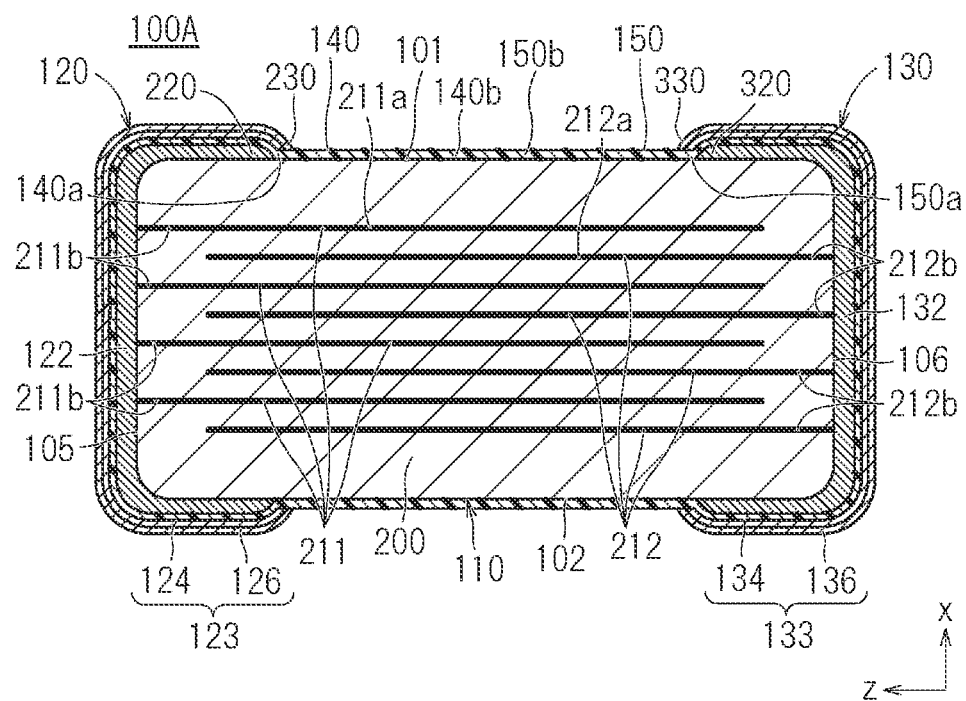
FIG. 5 is a sectional view showing a modification of a multilayer ceramic electronic component according to a preferred embodiment of the present invention.

For example, in a preferred embodiment of the present invention, no organic layer is provided at some portion between first external electrode 120 and second external electrode 130 of multilayer ceramic capacitor 100. However, the following configuration may be provided as shown in FIG. 5: the other end 140b of first organic layer 140 extends to the central portion of stack 110, the other end 150b of second organic layer 150 extends to the central portion of stack 110, these ends are in contact with each other at the central portion, and the organic layer is disposed over the entire exposed surface of stack 110 between first external electrode 120 and second external electrode 130.

As a result, a trigger for delamination can be provided, reliably allowing delamination between the base electrode layer and the plating layer when a stress occurs.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic electronic component comprising:
    a stack including a plurality of stacked ceramic layers and a plurality of stacked internal electrodes and including a first main surface and a second main surface opposed to each other in a stack direction, a first lateral surface and a second lateral surface opposed to each other in a width direction orthogonal or substantially orthogonal to the stack direction, and a first end surface and a second end surface opposed to each other in a length direction orthogonal or substantially orthogonal to the stack direction and the width direction;
    a first external electrode electrically connected to the internal electrodes, provided on the first end surface, and including ends extending on the first main surface, the second main surface, the first lateral surface, and the second lateral surface; and
    a second external electrode electrically connected to the internal electrodes, provided on the second end surface, and including ends extending on the first main surface, the second main surface, the first lateral surface, and the second lateral surface; wherein
    the first external electrode includes:
        a first base electrode layer including a conductive metal and a glass component;
        a first organic layer covering the first base electrode layer and including an organosilicon compound; and
        a first plating layer provided on the first organic layer;
    the second external electrode includes:
        a second base electrode layer including a conductive metal and a glass component;
        a second organic layer covering the second base electrode layer and including an organosilicon compound; and
        a second plating layer provided on the second organic layer;
    the first organic layer covers a surface of the stack from over the first base electrode layer, and the second organic layer covers the surface of the stack from over the second base electrode layer;
    the first plating layer includes a leading end which is in contact with the first organic layer, and the second plating layer includes a leading end which is in contact with the second organic layer; and
    a coverage rate B of the first organic layer provided on the first base electrode layer located on the first end surface, a coverage rate A of the first organic layer provided on the first base electrode layer located on the first main surface and the second main surface, and a coverage rate A of the first organic layer provided on the first main surface and the second main surface satisfy a relationship A>B, and a coverage rate B of the second organic layer provided on the second base electrode layer located on the second end surface, a coverage rate A of the second organic layer provided on the second base electrode layer located on the first main surface and the second main surface, and a coverage rate A of the second organic layer provided on the first main surface and the second main surface satisfy a relationship A>B.

2. The multilayer ceramic electronic component according to claim 1, wherein a coverage rate of the organic layer provided on the base electrode layer located on the lateral surface and a coverage rate of the organic layer provided on the lateral surface are substantially equal to the coverage rate A of the organic layer provided on the base electrode layer located on the main surface and the coverage rate A of the organic layer provided on the main surface.

3. The multilayer ceramic electronic component according to claim 1, wherein the coverage rate A of the organic layer is about 40% or more and about 80% or less, and the coverage rate B of the organic layer is about 10% or more and about 40% or less.

4. The multilayer ceramic electronic component according to claim 1, wherein a strength of adhesion between the stack and the first base electrode layer is higher than a strength of adhesion between the first organic layer and the first plating layer, and a strength of adhesion between the stack and the second base electrode layer is higher than a strength of adhesion between the second organic layer and the second plating layer.

5. The multilayer ceramic electronic component according to claim 1, wherein a strength of adhesion between the stack and the first organic layer is higher than a strength of adhesion between the first organic layer and the first plating layer, and a strength of adhesion between the stack and the second organic layer is higher than a strength of adhesion between the second organic layer and the second plating layer.

6. The multilayer ceramic electronic component according to claim 1, wherein the first organic layer and the second organic layer each include an organosilicon compound having a structure of multifunctional alkoxysilane $Si-(C_nH_{2n+1})_3$ and including element N.

7. The multilayer ceramic electronic component according to claim 1, wherein the multilayer ceramic electronic component is a multilayer ceramic capacitor.

8. A mount structure for a multilayer ceramic electronic component in which a multilayer ceramic electronic component according to claim 1 is mounted on a circuit board; wherein
    the circuit board includes a first signal electrode and a second signal electrode provided on a main surface thereof; and
    with the first main surface and the second main surface or the first lateral surface and the second lateral surface of the multilayer ceramic electronic component facing the main surface of the circuit board, the first external electrode of the multilayer ceramic electronic component and the first signal electrode of the circuit board are electrically connected to each other, and the second external electrode of the multilayer ceramic electronic component and the second signal electrode of the circuit board are electrically connected to each other.

9. The multilayer ceramic electronic component according to claim 1, wherein the multilayer ceramic electronic component functions as and defines a ceramic piezoelectric element, a thermistor element, or an inductor element.

10. The multilayer ceramic electronic component according to claim 1, wherein the plurality of stacked internal electrodes includes a coil-shaped conductor.

11. The multilayer ceramic electronic component according to claim 1, wherein the first plating layer and the second plating layer each include a two-layer structure of a Ni plating layer and a Sn plating layer.

12. The multilayer ceramic electronic component according to claim 1, wherein a portion of first organic layer which is provided on the stack has a thickness greater than a thickness of a portion of first organic layer which is provided on the first base electrode layer.

13. The multilayer ceramic electronic component according to claim 1, wherein a portion of second organic layer which is provided on the stack has a thickness greater than a thickness of a portion of second organic layer which is provided on second base electrode layer.

14. The multilayer ceramic electronic component according to claim 1, wherein portions of first organic layer and second organic layer which are disposed on the first main surface and the second main surface of the stack have a thickness of about 5 nm or more and about 100 nm or less.

15. The multilayer ceramic electronic component according to claim 1, wherein a portion of a space between the first external electrode and the second external electrode does not include the organic layer.

* * * * *